United States Patent
Im

(10) Patent No.: US 10,763,838 B2
(45) Date of Patent: Sep. 1, 2020

(54) SEMICONDUCTOR DEVICE AND SEMICONDUCTOR SYSTEM FOR DETECTING VOLTAGE-DROP LEVEL

(71) Applicant: SK hynix Inc., Gyeonggi-do (KR)

(72) Inventor: Jong-Man Im, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 16/440,235

(22) Filed: Jun. 13, 2019

(65) Prior Publication Data

US 2020/0186138 A1    Jun. 11, 2020

(30) Foreign Application Priority Data

Dec. 5, 2018 (KR) ........................ 10-2018-0155017

(51) Int. Cl.

| | | |
|---|---|---|
| *G05F 1/00* | (2006.01) | |
| *G05F 1/10* | (2006.01) | |
| *G05F 1/565* | (2006.01) | |
| *H02M 3/156* | (2006.01) | |
| *H03K 5/24* | (2006.01) | |
| *H02M 3/07* | (2006.01) | |
| *G01R 19/165* | (2006.01) | |
| *G05F 3/08* | (2006.01) | |
| *H03K 3/03* | (2006.01) | |

(52) U.S. Cl.
CPC .......... *H03K 5/24* (2013.01); *G01R 19/16576* (2013.01); *G05F 3/08* (2013.01); *H02M 3/07* (2013.01); *H03K 3/0315* (2013.01)

(58) Field of Classification Search
CPC .. H03K 5/24; H03K 3/0315; G01R 19/16576; G05F 3/08; H02M 3/07
See application file for complete search history.

(56) References Cited

U.S. PATENT DOCUMENTS

| | | | | |
|---|---|---|---|---|
| 5,719,534 | A * | 2/1998 | Imura | ..................... H03K 3/012 331/116 FE |
| 6,670,860 | B2 * | 12/2003 | Kobayashi | ............... H03B 5/06 331/158 |
| 6,882,231 | B2 * | 4/2005 | Rolandi | ............... H03K 3/0315 331/1 A |
| 8,797,088 | B2 * | 8/2014 | Chan | ....................... G05F 1/625 327/536 |
| 9,252,757 | B2 * | 2/2016 | Chao | ........................ H03K 4/90 |
| 9,306,577 | B2 * | 4/2016 | Huang | ..................... H03L 1/00 |
| 2012/0256693 | A1 * | 10/2012 | Raghunathan | ........ H03L 7/0805 331/34 |
| 2017/0040985 | A1 | 2/2017 | Chen et al. | |

FOREIGN PATENT DOCUMENTS

KR    10-1408201    6/2014

* cited by examiner

*Primary Examiner* — Kenneth B Wells
(74) *Attorney, Agent, or Firm* — IP & T Group LLP

(57) ABSTRACT

A semiconductor device includes a voltage adjust circuit suitable for generating an adjusting voltage according to a counting signal; an oscillating circuit operable by an oscillating control signal, and suitable for outputting an operational clock signal whose frequency is controlled by the adjusting voltage; a pumping circuit suitable for generating an internal voltage by pumping a source voltage according to the operational clock signal; and a counting circuit suitable for generating the counting signal by counting the operational clock signal according to the oscillating control signal.

17 Claims, 9 Drawing Sheets

SEMICONDUCTOR DEVICE AND SEMICONDUCTOR SYSTEM FOR DETECTING VOLTAGE-DROP LEVEL

CROSS-REFERENCE TO RELATED APPLICATIONS

This application claims priority under 35 U.S.C. § 119(a) to Korean Patent Application No. 10-2018-0155017, filed on Dec. 5, 2018, the disclosure of which is incorporated herein by reference in its entirety.

BACKGROUND

1. Field

Various exemplary embodiments of the present invention generally relate to a semiconductor design technique. Particularly, the embodiments relate to a semiconductor device for detecting a degree to which an internal voltage is out of a target voltage level.

2. Description of the Related Art

A semiconductor device operates on power supply voltages supplied from an external system. The semiconductor device may generate a plurality of internal voltages having various voltage levels required for internal operations thereof, using the external power supply voltages. In order to generate the internal voltages with more stable voltage levels, it is necessary to monitor the degree to which the internal voltages are out of a target voltage level (e.g., voltage drop levels).

In general, there is no way to directly measure the voltage drop level of the internal voltage since it occurs inside the semiconductor device. To monitor the internal voltage at a desired measurement location inside the semiconductor device, a pad has to be inserted into the semiconductor device and the internal voltage is monitored at the measurement location through the pad. In this case, it is difficult to accurately monitor the voltage drop level of the internal voltage because it acts as a very large load when a measurement equipment (i.e., a tester) is in contact with the pad.

SUMMARY

Various embodiments of the present invention are directed to a semiconductor device and a semiconductor system for detecting a voltage drop level of an internal voltage.

In accordance with an embodiment of the present invention, a semiconductor device includes: a voltage adjust circuit suitable for generating an adjusting voltage according to a counting signal; an oscillating circuit operable by an oscillating control signal, and suitable for outputting an operational clock signal whose frequency is controlled by the adjusting voltage; a pumping circuit suitable for generating an internal voltage by pumping a source voltage according to the operational clock signal; and a counting circuit suitable for generating the counting signal by counting the operational clock signal according to the oscillating control signal.

In accordance with an embodiment of the present invention, a semiconductor device includes: a voltage adjust circuit suitable for generating an adjusting voltage according to a counting signal; a reference voltage generation circuit suitable for adjusting a voltage level of a reference voltage according to the adjusting voltage; a detecting circuit suitable for outputting an oscillating control signal by comparing the reference voltage with an internal voltage; an oscillating circuit suitable for outputting an operational clock signal in response to the oscillating control signal; a pumping circuit suitable for generating the internal voltage by pumping a source voltage according to the operational clock signal; and a counting circuit suitable for generating the counting signal by counting the operational clock signal according to the oscillating control signal.

In accordance with an embodiment of the present invention, a semiconductor system includes: a first semiconductor device that includes a voltage adjust circuit suitable for generating an adjusting voltage according to a counting signal; and a second semiconductor device that includes: a voltage generation circuit operable by an oscillating control signal, and suitable for outputting an operational clock signal according to the adjusting voltage and generating an internal voltage by pumping a source voltage according to the operational clock signal; and a counting circuit suitable for generating the counting signal by counting the operational clock signal according to the oscillating control signal.

In accordance with an embodiment of the present invention, a semiconductor system includes: a voltage adjust circuit suitable for generating an adjusting voltage having a variable level dependent on a variable frequency; an oscillating circuit suitable for generating, while an internal voltage is lower than a reference voltage, an operational clock signal having the frequency dependent on the level; and a pumping circuit suitable for generating the internal voltage according to the frequency.

DETAILED DESCRIPTION

Figure 1:
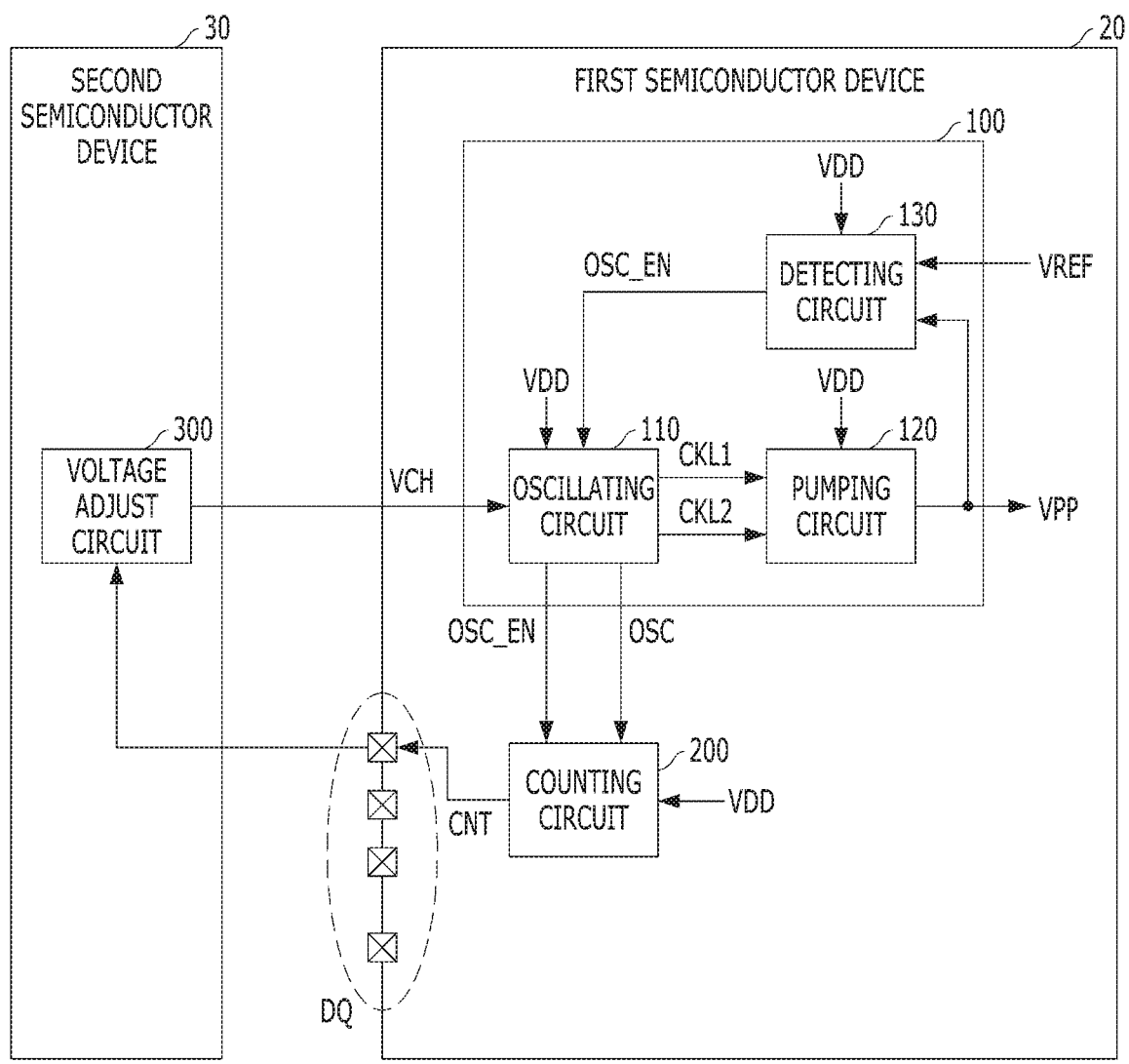
FIG. 1 is a block diagram illustrating a semiconductor system in accordance with an embodiment of the present invention.

Various exemplary embodiments of the present invention will be described below in more detail with reference to the accompanying drawings. The present invention may, however, be embodied in different forms and should not be construed as limited to the embodiments set forth herein.

Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

Semiconductor memory devices, among semiconductor devices, may generate a plurality of internal voltages having various levels using an external voltage. The internal voltages are used for various internal operations of the semiconductor memory devices.

Existing methods for generating the internal voltages using the external voltage are largely divided into two schemes. According to a first scheme, an internal voltage lower than an external voltage may be generated by down-converting the external voltage to a lower potential. According to a second scheme, an internal voltage higher than an external voltage or lower than a ground voltage may be generated by charge-pumping the external voltage.

A high voltage VPP and a back-bias voltage VBB are widely used as the internal voltages generated by charge-pumping the external voltage. The high voltage VPP is generated in order for a gate of a cell transistor (or word line) to have a higher potential than a source voltage VDD, i.e., the external voltage, thereby accessing a memory cell without a loss of cell data. The back-bias voltage VBB is generated in order for a bulk of a cell transistor to have a lower potential than a ground voltage VSS, i.e., the external voltage, thereby preventing a loss of cell data.

Hereinafter, a voltage generation circuit for generating the high voltage VPP using the source voltage VDD will be described as a representative example.

FIG. 1 is a block diagram illustrating a semiconductor system 10 in accordance with an embodiment of the present invention.

Referring to FIG. 1, the semiconductor system 10 may include a first semiconductor device 20 and a second semiconductor device 30. The first semiconductor device 20 may include a memory device, and the second semiconductor device 30 may include a memory controller for controlling the memory device, or a test device for testing/monitoring the memory device.

The second semiconductor device 30 may include a voltage adjust circuit 300 for generating an adjusting voltage VCH according to a counting signal CNT. The voltage adjust circuit 300 may provide the adjusting voltage VCH to the first semiconductor device 20. The voltage adjust circuit 300 may increase a voltage level of the adjusting voltage VCH in proportion to a counting value of the counting signal CNT.

The first semiconductor device 20 may include a voltage generation circuit 100 and a counting circuit 200.

The voltage generation circuit 100 may be operable by an oscillating control signal OSC_EN, and generate operational clock signals CLK1 and CLK2 whose frequency is controlled by the adjusting voltage VCH. The voltage generation circuit 100 may generate a high voltage VPP by pumping a source voltage VDD according to the operational clock signals CLK1 and CLK2.

The counting circuit 200 may generate the counting signal CNT by counting an oscillating signal OSC corresponding to the operational clock signals CLK1 and CLK2 in response to the oscillating control signal OSC_EN. The counting circuit 200 may be activated by a rising edge of the oscillating control signal OSC_EN and may be initialized by a falling edge of the oscillating control signal OSC_EN. In the case where the first semiconductor device 20 is a memory device, the counting signal CNT may be outputted to the second semiconductor device 30 through at least one data input/output (I/O) pad, i.e., DQ pads. The counting signal CNT may be a multi-bit signal. The multi-bit values of the counting signal CNT may be serially outputted through any of the DQ pads or may be outputted in parallel through some of the DQ pads.

In detail, the voltage generation circuit 100 may include an oscillating circuit 110, a pumping circuit 120, and a detecting circuit 130.

The oscillating circuit 110 may be activated by the oscillating control signal OSC_EN, and output the operational clock signals CLK1 and CLK2 whose frequency is controlled by the adjusting voltage VCH. The operational clock signals CLK1 and CLK2 may include a first clock signal CLK1 and a second clock signal CLK2, which have an opposite phase to each other. The oscillating circuit 110 may output the oscillating signal OSC which has the same phase as one of the first clock signal CLK1 and the second clock signal CLK2. Hereinafter, a case where the oscillating circuit 110 outputs the oscillating signal OSC having the same phase as the first clock signal CLK1 is described as a representative example.

The pumping circuit 120 may generate the high voltage VPP by pumping the source voltage VDD according to the first clock signal CLK1 and the second clock signal CLK2. The pumping circuit 120 may pump the source voltage VDD faster such that the level of the source voltage VDD as the high voltage VPP reaches a target voltage level in shorter time as a frequency of the first clock signal CLK1 and the second clock signal CLK2 increases.

The detecting circuit 130 may output the oscillating control signal OSC_EN by comparing a reference voltage VREF with the high voltage VPP. For example, the detecting circuit 130 enables the oscillating control signal OSC_EN to a logic high level when a voltage level of the high voltage VPP is lower than the reference voltage VREF. The detecting circuit 130 disables the oscillating control signal OSC_EN to a logic low level when the voltage level of the high voltage VPP is higher than or equal to the reference voltage VREF.

Meanwhile, in the semiconductor system 10 of FIG. 1, the voltage adjust circuit 300 is provided in the second semiconductor device 30. However, the present invention is not limited thereto. According to an embodiment, the voltage adjust circuit 300 may be provided in the first semiconductor device 20, with the voltage generation circuit 100

As described above, the present invention can detect a voltage drop level of an internal voltage in real time, using the voltage generation circuit 100 within a semiconductor device. Additionally, the present invention can adjust a voltage level of the internal voltage based on a voltage drop detection result (i.e. the counting signal CNT) to generate the internal voltage having a more stable voltage level.

Figure 2:
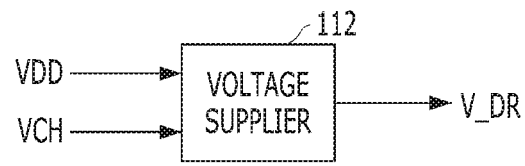
FIG. 2 is a circuit diagram of an oscillating circuit shown in FIG. 1.
Figure 2:
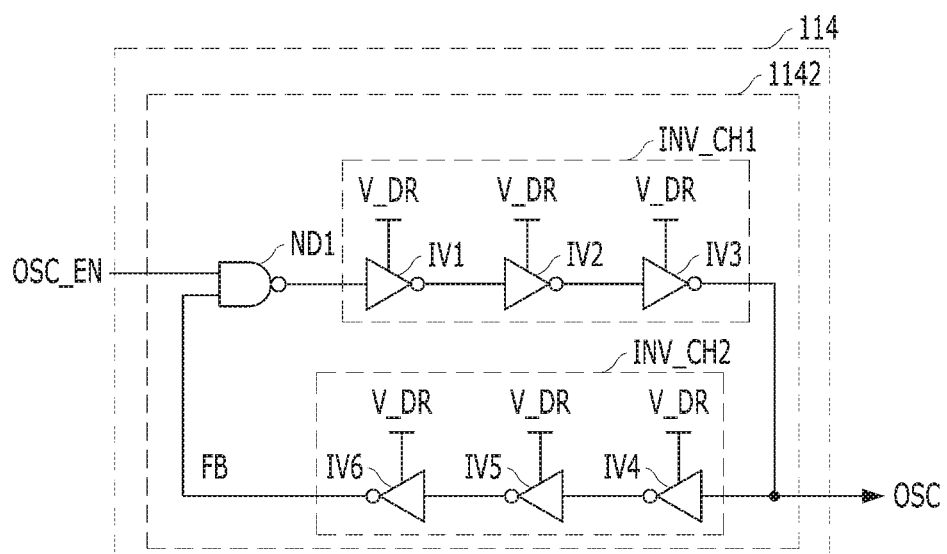
Figure 2:
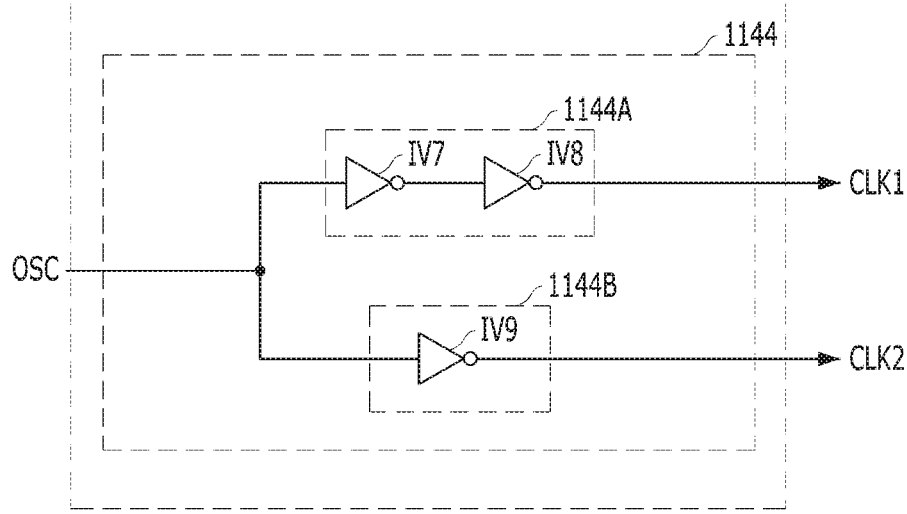

FIG. 2 is a circuit diagram of the oscillating circuit 110 shown in FIG. 1.

Referring to FIG. 2, the oscillating circuit 110 may include a voltage supplier 112 and an oscillator 114. The voltage supplier 112 may provide a driving voltage V_DR according to the source voltage VDD or the adjusting voltage VCH. The voltage supplier 112 may output the source voltage VDD as the driving voltage V_DR when the adjusting voltage VCH is not inputted from the second semiconductor device 30. The voltage supplier 112 may output the adjusting voltage VCH as the driving voltage V_DR when the adjusting voltage VCH is inputted from the second semiconductor device 30.

The oscillator 114 may generate the oscillating signal OSC by using the driving voltage V_DR, and generate the first clock signal CLK1 and the second clock signal CLK2 according to the oscillating signal OSC. The oscillator 114 may include a first period section 1142 and a second period section 1144.

The first period section 1142 may be implemented with a ring oscillator. The first period section 1142 may include a NAND gate ND1, a first inverter chain INV_CH1 and a second inverter chain INV_CH2. Each of the first inverter chain INV_CH1 and the second inverter chain INV_CH2 may include an odd number of inverters. For example, the first inverter chain INV_CH1 may include first to third inverters IV1 to IV3, and the second inverter chain INV_CH2 may include fourth to sixth inverters IV4 to IV6. The NAND gate ND1 may perform a NAND operation on the oscillating control signal OSC_EN and a feedback signal FB. The first inverter chain INV_CH1 may invert and delay an output of the NAND gate ND1 to output the oscillating signal OSC. The second inverter chain INV_CH2 may invert and delay the oscillating signal OSC to output the feedback signal FB to the NAND gate ND1. As described above, the first period section 1142 may output the oscillating signal OSC which toggles with a frequency corresponding to the driving voltage V_DR when the oscillating control signal OSC_EN is enabled to a logic high level.

The second period section 1144 may include a first clock generator 1144A and a second clock generator 1144B. The first clock generator 1144A may buffer the oscillating signal OSC to output the first clock signal CLK1. The first clock generator 1144A may include seventh and eighth inverters IV7 and IV8. The second clock generator 1144B may invert the oscillating signal OSC to output the second clock signal CLK2. The second clock generator 1144B may include a ninth inverter IV9. As described above, the second period section 1144 may output the first clock signal CLK1 having substantially the same phase and frequency as the oscillating signal OSC, and output the second clock signal CLK2 having substantially the same frequency as the oscillating signal OSC but having a phase opposite to the oscillating signal OSC. According to an embodiment, the first clock signal CLK1 and the second clock signal CLK2 may be designed so that they are alternately enabled within one cycle.

Figure 3:
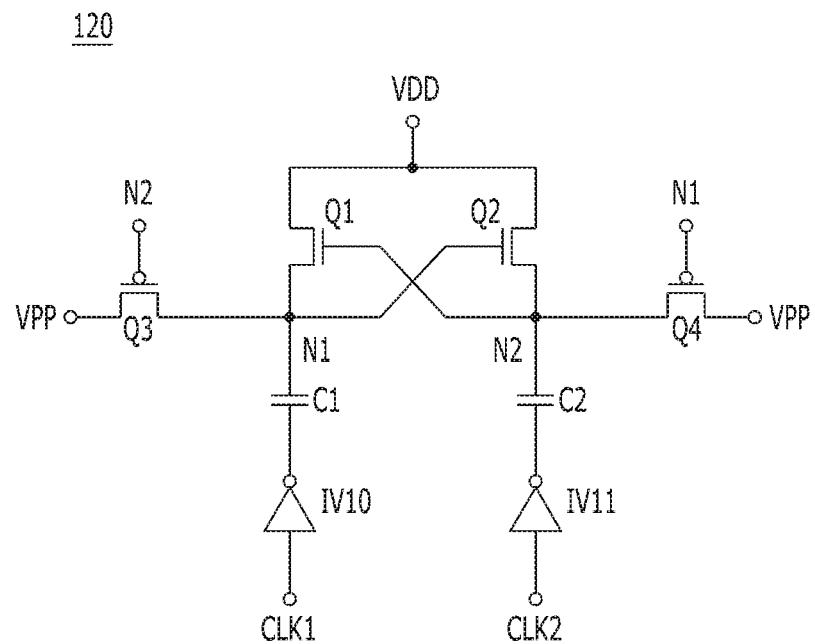
FIG. 3 is a circuit diagram of a pumping circuit shown in FIG. 1, in accordance with an embodiment of the present invention.

FIG. 3 is a circuit diagram of the pumping circuit 120 shown in FIG. 1.

Referring to FIG. 3, the pumping circuit 120 may be a cross-coupled charge pump circuit for amplifying an input voltage, i.e., the source voltage VDD, and output an output voltage, i.e., the high voltage VPP.

The pumping circuit 120 may include first to fourth transistors Q1 to Q4, first and second capacitors C1 and C2, and first and second inverters IV10 and IV11. The first and second transistors Q1 and Q2 may be composed of NMOS transistors. The third and fourth transistors Q3 and Q4 may be composed of PMOS transistors. The first and second transistors Q1 and Q2 may have drains coupled to the source voltage VDD, and gates and sources which are cross-coupled with each other. The first and second transistors Q1 and Q2 may be turned on/off in response to the first clock signal CLK1 and the second clock signal CLK2. The third and fourth transistors Q3 and Q4 may have drains coupled to an output terminal of the pumping circuit 120, sources coupled to those of the first and second transistors Q1 and Q2 at a first node N1 and a second node N2, respectively, and gates coupled to those of the first and second transistors Q1 and Q2 at the second node N2 and the first node N1, respectively. The high voltage VPP may be outputted from the output terminal. The third and fourth transistors Q3 and Q4 may be turned on/off in response to the first clock signal CLK1 and the second clock signal CLK2.

An operation of the pumping circuit 120 is described as follows.

When the source voltage VDD is supplied, the first and second transistors Q1 and Q2 may alternately apply the source voltage VDD to the first node N1 and the second node N2. Under this circumstance, when the first clock signal CLK1 and the second clock signal CLK2 are applied, the first and second capacitors C1 and C2 store a charging voltage (VC) and alternately apply the charging voltage (VC) to the first node N1 and the second node N2. As a result, a voltage having a value "VDD+VC" may be alternately applied at the first node N1 and the second node N2. Finally, the voltage at the first node N1 and the second node N2 may be outputted at the output terminal through the third and fourth transistors Q3 and Q4.

As described above, the pumping circuit 120 may vary the charging voltage (VC) according to the frequency/amplitude of the first clock signal CLK1 and the second clock signal CLK2 thereby varying a charge pump ratio thereof.

Figure 4:
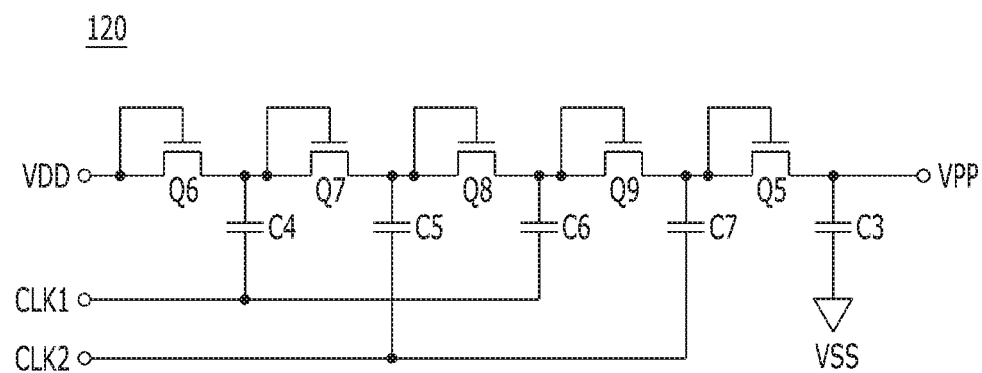
FIG. 4 is a circuit diagram of a pumping circuit shown in FIG. 1, in accordance with another embodiment of the present invention.

FIG. 4 is a circuit diagram of another example of the pumping circuit 120 shown in FIG. 1.

Referring to FIG. 4, the pumping circuit 120 may include first to fourth transistors Q6 to Q9, first to fourth capacitors C4 to C7, an output transistor Q5, and an output capacitor C3. The transistors Q5 to Q9 may be, for example, NMOS transistors having drain and gate coupled to each other to function as a diode.

The first to fourth transistors Q6 to Q9 and the output transistor Q5 may be coupled in series between an input terminal and an output terminal of the pumping circuit 120. The first clock signal CLK1 and the second clock signal CLK2 may be alternately applied to a common node of two adjacent transistors of the first to fourth transistors Q6 to Q9 and the output transistor Q5, through the first to fourth capacitors C4 to C7, except for the output capacitor C3 coupled to the output terminal.

During a first half cycle, the first clock signal CLK1 has a logic low level and the second clock signal CLK2 has a logic high level. The first capacitor C4 may be charged with the source voltage VDD. During a subsequent half cycle, the first clock signal CLK1 has a logic high level and the second clock signal CLK2 has a logic low level. The first clock signal CLK1 may cause a voltage of the first capacitor C4 to increase to a level twice that of the source voltage VDD. Further, the first transistor Q6 may be turned off, the second transistor Q7 may be turned on. Thus, a voltage of the second capacitor C5 may increase to a level twice that of the source voltage VDD.

During a first half cycle subsequent to the first cycle, the first clock signal CLK1 has a logic low level and the second clock signal CLK2 has a logic high level. The second clock signal CLK2 may cause the voltage of the second capacitor C5 to increase to a level three times that of the source voltage VDD, and the third capacitor C6 may be charged with the voltage of the second capacitor C5. Through such a process, the pumping circuit 120 may amplify the source voltage VDD to generate the high voltage VPP. For example, when the pumping circuit 120 includes an N number of transistors, the high voltage VPP may be N times the source voltage VDD.

Figure 5:
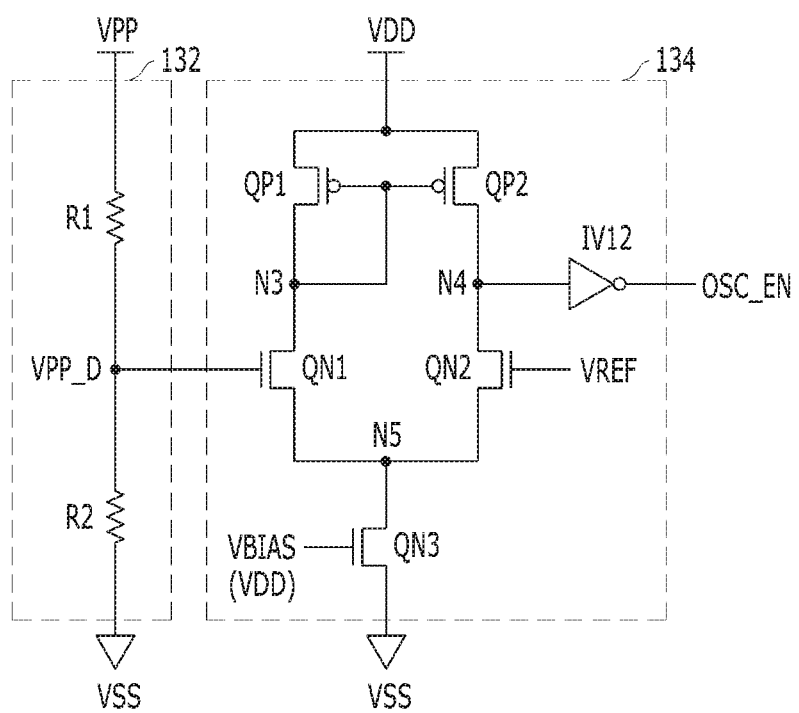
FIG. 5 is a circuit diagram of a detecting circuit shown in FIG. 1.

FIG. 5 is a circuit diagram of the detecting circuit 130 shown in FIG. 1.

Referring to FIG. 5 the detecting circuit 130 may include a voltage divider 132 and a voltage comparator 134.

The voltage divider 132 may output a division voltage VPP_D by dividing high voltage VPP outputted from the pumping circuit 120 by a certain ratio. The voltage divider 132 may include a first resistor R1 and a second resistor R2 coupled in series between a high voltage (VPP) terminal and a ground voltage (VSS) terminal.

The voltage comparator 134 may output the oscillating control signal OSC_EN by comparing the division voltage VPP_D with the reference voltage VREF. Preferably, the voltage comparator 134 may be composed of a differential amplifier.

The voltage comparator 134 may include first to fifth transistors QP1, QP2, QN1, QN2 and QN3 and an inverter IV12. The first and second transistors QP1 and QP2 may be composed of PMOS transistors, and the third to fifth transistors QN1, QN2 and QN3 may be composed of NMOS transistors. The first transistor QP1 is coupled between a supply voltage (VDD) terminal and a first node N3. The second transistor QP2 is coupled between the VDD terminal and a second node N4. The first and second transistors QP1 and QP2 may be composed of a current mirror-type PMOS transistors whose gates are coupled to the first node N3 in common. The third transistor QN1 is coupled between the first node N3 and a third node N5, and receives the division voltage VPP_D through its gate. The fourth transistor QN2 is coupled between the second node N4 and the third node N5, and receives the reference voltage VREF through its gate. The fifth transistor QN3 is coupled between the third node N5 and the VSS terminal, and receives a bias voltage VBIAS (i.e., a source voltage VDD) through its gate. The inverter IV12 inverts a signal at the second node N4 to output the oscillating control signal OSC_EN.

An operation of the voltage comparator 134 is described as follows.

Signals at the first and second nodes N3 and N4 have logic levels different from each other according to voltage levels of the division voltage VPP_D and the reference voltage VREF applied to the third and fourth transistors QN1 and QN2. For example, when the division voltage VPP_D has a voltage level greater than the reference voltage VREF, the third transistor QN1 is turned on so that the ground voltage VSS is applied to the first node N3, and the signal at the second node N4 becomes a logic high level. Accordingly, the oscillating control signal OSC_EN of a logic low level is outputted through the inverter IV12. The oscillating circuit 110 may be disabled in response to the oscillating control signal OSC_EN of a logic low level, and stops an oscillating operation. Accordingly, the voltage level of the high voltage VPP outputted by the pumping circuit 120 decreases.

On the contrary, when the division voltage VPP_D has a voltage level less than the reference voltage VREF, the fourth transistor QN2 is turned on so that the ground voltage VSS is applied to the second node N4, and thus the oscillating control signal OSC_EN of a logic high level is outputted through the inverter IV12. The oscillating circuit 110 may be activated to perform the oscillating operation. Accordingly, the voltage level of the high voltage VPP outputted by the pumping circuit 120 increases.

In sum, the voltage comparator 134 may output the oscillating control signal OSC_EN for stopping the oscillating operation of the oscillating circuit 110 when the division voltage VPP_D has a voltage level greater than the reference voltage VREF. The voltage comparator 134 may output the oscillating control signal OSC_EN for performing the oscillating operation of the oscillating circuit 110 when the division voltage VPP_D has a voltage level less than the reference voltage VREF.

Meanwhile, since semiconductor devices are increasingly demanding refinement, even transistors configured to have the same characteristics within the semiconductor device can be subject to fine differences due to process variation. Thus, it is necessary to implement a device capable of monitoring characteristics of the transistors placed within the semiconductor device.

A semiconductor device may include a ring oscillator delay (ROD) having characteristics dependent on a process, a voltage and a temperature (PVT) variation. The ROD may measure individual characteristics, for example, an operating speed, of a NMOS transistor and a PMOS transistor therein to monitor process variations. This may allow the semiconductor device to compensate an operation according to a monitoring result. The ROD may use a counting circuit when measuring the operating speed of the NMOS transistor and the PMOS transistor therein. In accordance with an embodiment of the present invention, the counting circuit 200 may be implemented with a counter used in a ROD provided in the first semiconductor 20.

Figure 6:
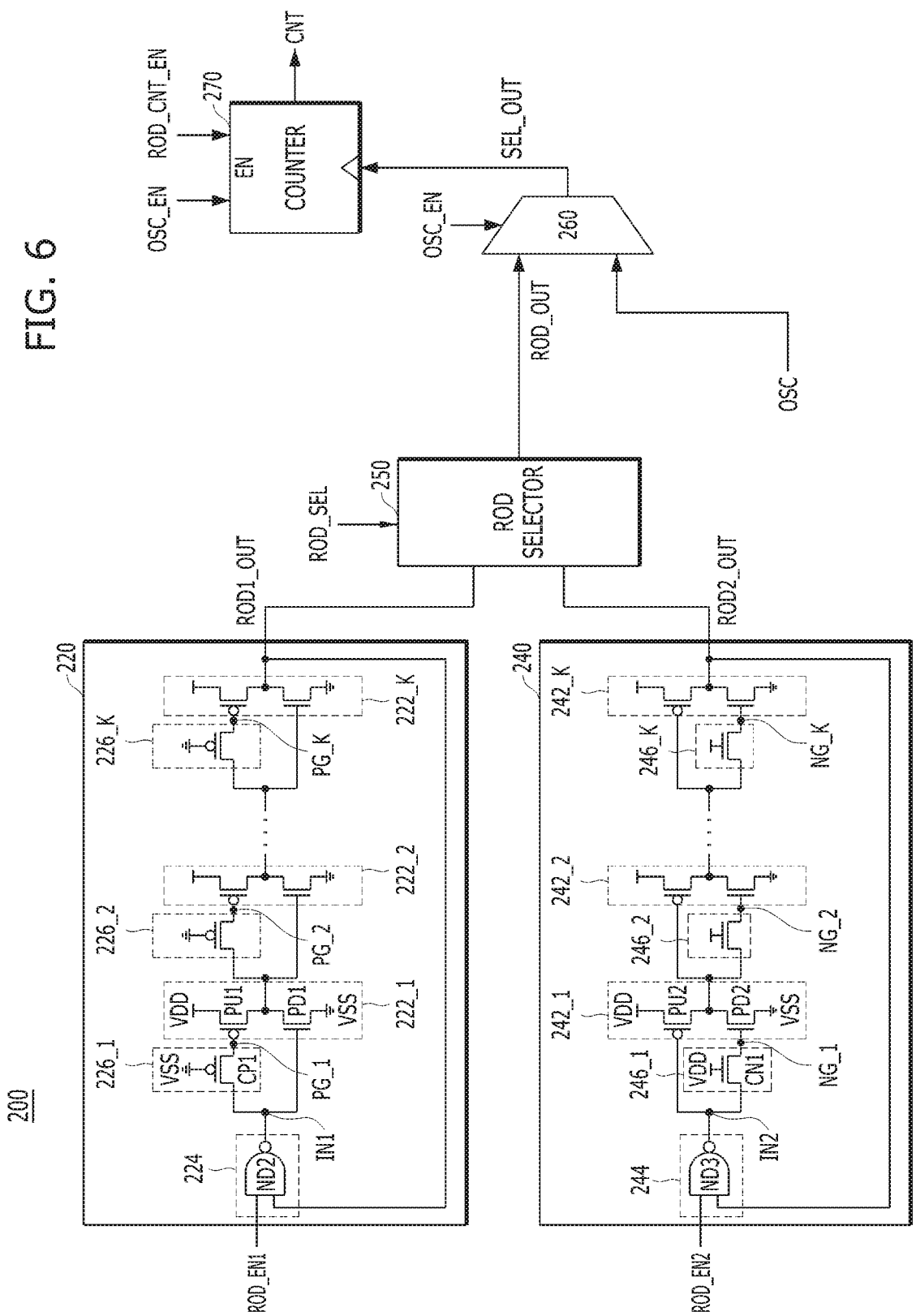
FIG. 6 is a circuit diagram of a counting circuit shown in FIG. 1, in accordance with an embodiment of the present invention.

FIG. 6 is a circuit diagram of the counting circuit 200 shown in FIG. 1.

Referring to FIG. 6, the counting circuit 200 may include a first monitoring block 220, a second monitoring block 240, a ROD selector 250, a counting selector 260, and a counter 270.

The first monitoring block 220 may be embodied in a ROD for monitoring characteristics of a PMOS transistor. The second monitoring block 240 may be embodied in a ROD for monitoring characteristics of an NMOS transistor.

The first monitoring block 220 may include a plurality of first delay cells 222_1 to 222_K coupled in series to each other, and a first monitoring control unit 224 for controlling the first delay cells 222_1 to 222_K to perform a monitoring operation based on a first enable signal ROD_EN1. The first delay cells 222_1 to 222_K may be composed of an even number, that is, K is an even number. The first delay cells 222_1 to 222_K constitute a delay chain composed of a plurality of inverters. Each of the first delay cells 222_1 to 222_K may include a pull-up transistor PU1 and a pull-down transistor PD1 that are coupled in series to each other. When the first enable signal ROD_EN1 is enabled, the first monitoring control unit 224 may invert an output of the delay cell 222_K disposed last among the first delay cells 222_1 to 222_K, that is, a first monitoring signal ROD1_OUT, to provide an inverted signal of the first monitoring signal ROD1_OUT to an input terminal IN1 of the delay cell 222_1 disposed first among the first delay cells 222_1 to 222_K. The first monitoring control unit 224 may be composed of a NAND gate ND2 that performs a NAND operation on the first enable signal ROD_EN1 and the first monitoring signal ROD1_OUT.

The first monitoring block 220 may further include a plurality of pull-up coupling units 226_1 to 226_K which maintain a turn-on state. The respective pull-up coupling units 226_1 to 226_K are arranged between input terminals and gates of the pull-up transistors PU1 of the respective first delay cells 222_1 to 222_K. By way of example but not limitation, the first pull-up coupling unit 226_1 may be composed of a PMOS transistor CP1 whose one side is coupled to the input terminal IN1 of the first delay cell 222_1, the other side is coupled to the gate of the pull-up transistor PU1 of the first delay cell 222_1, and gate is coupled to a ground voltage VSS terminal. The first monitoring block 220 may monitor the characteristics of the PMOS transistor, i.e., the pull-up transistor PU1 by using the pull-up coupling units 226_1 to 226_K, each of which is arranged in front of the gate of the pull-up transistor PU1.

The second monitoring block 240 may include a plurality of second delay cells 242_1 to 242_K coupled in series to each other, and a second monitoring control unit 244 for controlling the second delay cells 242_1 to 242_K to perform a monitoring operation based on a second enable signal ROD_EN2. The second delay cells 242_1 to 242_K may be composed of an even number, that is, K is an even number. The second delay cells 242_1 to 242_K constitute a delay chain composed of a plurality of inverters. Each of the second delay cells 242_1 to 242_K may include a pull-up transistor PU2 and a pull-down transistor PD2 that are coupled in series to each other. When the second enable signal ROD_EN2 is enabled, the second monitoring control unit 244 may invert an output of the delay cell 242_K disposed last among the second delay cells 242_1 to 242_K, that is, a second monitoring signal ROD2_OUT, to provide an inverted signal of the second monitoring signal ROD2_OUT to an input terminal IN2 of the delay cell 242_1 disposed first among the second delay cells 242_1 to 242_K. The second monitoring control unit 244 may be composed of a NAND gate ND3 that performs a NAND operation on the second enable signal ROD_EN2 and the second monitoring signal ROD2_OUT.

The second monitoring block 240 may further include a plurality of pull-down coupling units 246_1 to 246_K which maintain a turn-on state. The respective pull-down coupling units 246_1 to 246_K are arranged between input terminals and gates of the pull-down transistors PD2 of the respective second delay cells 242_1 to 242_K. By way of example but not limitation, the first pull-down coupling unit 246_1 may be composed of an NMOS transistor CN1 whose one side is coupled to the input terminal IN2 of the second delay cell 242_1, the other side is coupled to a gate of the pull-up transistor PU2 of the second delay cell 242_1, and gate is coupled to a power source voltage VDD terminal. The second monitoring block 240 may monitor the characteristics of the NMOS transistor, i.e., the pull-down transistor PD2 by using the pull-down coupling units 246_1 to 246_K, each of which is arranged in front of the gate of the pull-down transistor PD2.

The ROD selector 250 may select the first monitoring signal ROD1_OUT or the second monitoring signal ROD2_OUT in response to a ROD selection signal ROD_SEL. The ROD selector 250 may output the selected signal as a ROD monitoring signal ROD_OUT. The ROD selection signal ROD_SEL may have a logic low level when the first enable signal ROD_EN1 is enabled, and the ROD selection signal ROD_SEL may have a logic high level when the second enable signal ROD_EN2 is enabled.

The counting selector 260 may select the ROD monitoring signal ROD_OUT outputted from the ROD selector 250 or the oscillating signal OSC outputted from the oscillating circuit 110 in response to the oscillating control signal OSC_EN. The counting selector 260 may output the selected signal as a final monitoring signal SEL_OUT. The counting selector 260 may output the final monitoring signal SEL_OUT by selecting the ROD monitoring signal ROD_OUT when the oscillating control signal OSC_EN is disabled. The counting selector 260 may output the final monitoring signal SEL_OUT by selecting the oscillating signal OSC when the oscillating control signal OSC_EN is enabled.

The counter 270 may count a toggling number of the final monitoring signal SEL_OUT based on a counting enable signal ROD_CNT_EN or the oscillating control signal OSC_EN. The counter 270 may output a counted toggling number as the counting signal CNT. The counting enable signal ROD_CNT_EN may be enabled when either the first enable signal ROD_EN1 or the second enable signal ROD_EN2 is enabled. The counter 270 may perform a counting operation when the counting enable signal ROD_CNT_EN or the oscillating control signal OSC_EN is enabled. The counter 270 may initialize the counting signal when the counting enable signal ROD_CNT_EN or the oscillating control signal OSC_EN is disabled. For example, the counter 270 may initialize the counting signal in response to a falling edge of the oscillating control signal OSC_EN.

Although not illustrated, the counting circuit 200 may further include a decoder that receives mode set signals from a mode register set (MRS) or a test mode register set (TMRS), and decodes the mode set signals to generate the first enable signal ROD_EN1 and the second enable signal ROD_EN2.

When the first enable signal ROD_EN1 or the second enable signal ROD_EN2 is enabled, the first monitoring block 220, the second monitoring block 240 and the ROD selector 250 of the counting circuit 200 may monitor the characteristics of the PMOS transistor or the characteristics of the NMOS transistor, and output the ROD monitoring signal ROD_OUT. The counting selector 260 may output the ROD monitoring signal ROD_OUT as the final monitoring signal SEL_OUT when the oscillating control signal OSC_EN is disabled. The counter 270 may count the toggling number of the final monitoring signal SEL_OUT, and output the counting signal CNT. At this time, the first semiconductor 20 may monitor the process variation based on the counting signal CNT, and compensate an operation according to a monitoring result.

On the contrary, when the oscillating control signal OSC_EN is enabled, the counting selector 260 may output oscillating signal OSC as the final monitoring signal SEL_OUT. The counter 270 may count the toggling number of the final monitoring signal SEL_OUT, and output the counting signal CNT. At this time, the voltage adjust circuit 300 may generate the adjusting voltage VCH according to the counting signal CNT. The voltage adjust circuit 300 may increase the voltage level of the adjusting voltage VCH in proportion to the counting value of the counting signal CNT.

In accordance with an embodiment of the present invention, the counting circuit 200 may be implemented by using an existing ROD, thereby detecting a voltage drop level of an internal voltage without increasing an area.

Hereinafter, an operation of detecting a voltage drop level of an internal voltage will be described with reference to FIG. 1 to FIG. 7B.

Figure 7A:
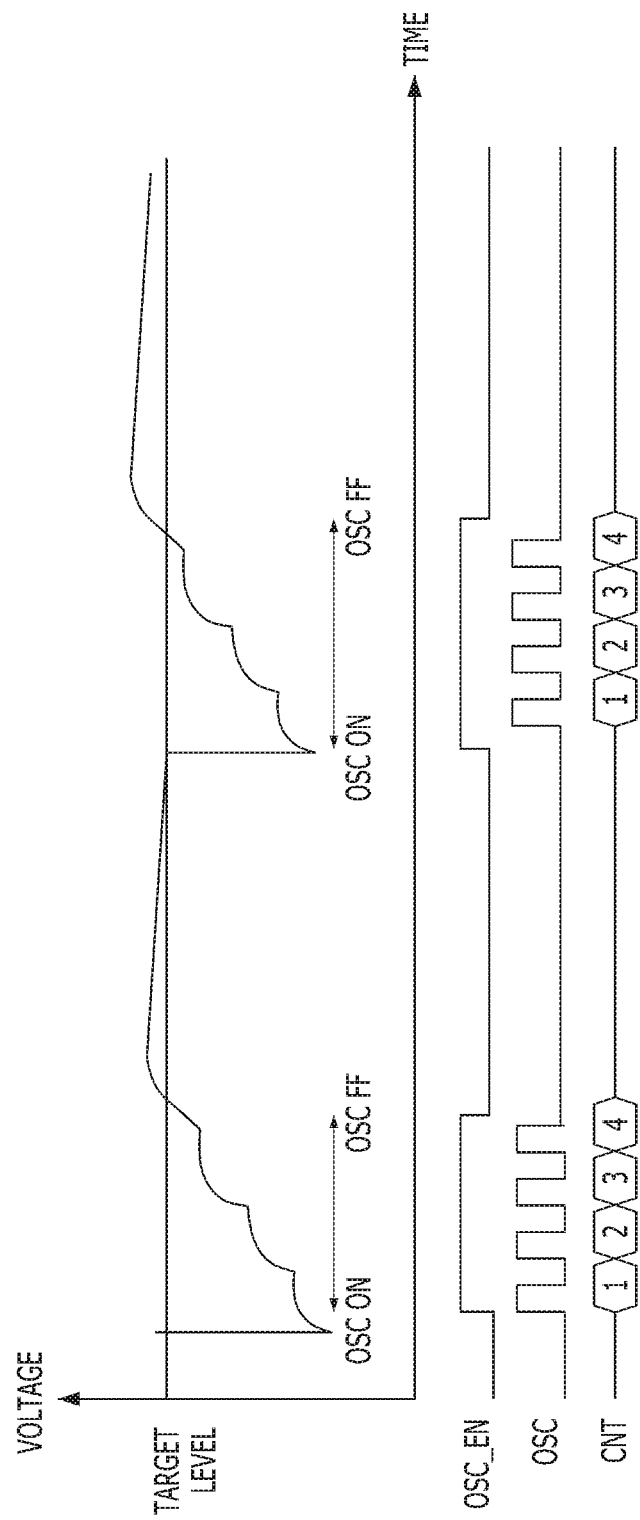
FIGS. 7A and 7B are timing diagrams for describing an operation of detecting a voltage drop level of an internal voltage in accordance with an embodiment of the present invention.
Figure 7B:
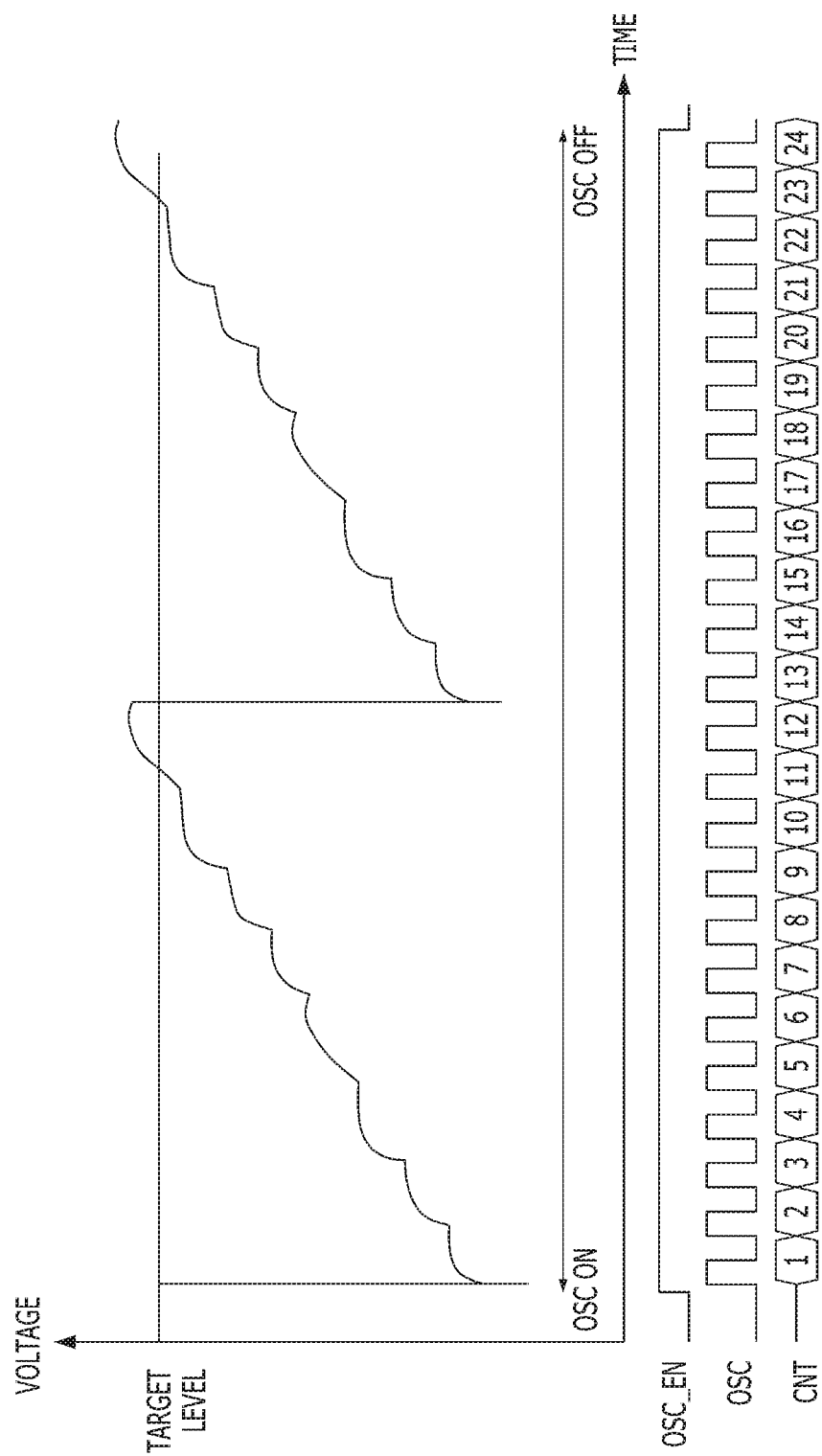

FIGS. 7A and 7B are timing diagrams for describing an operation of detecting a voltage drop level of an internal voltage in accordance with an embodiment of the present invention.

Referring to FIG. 7A, it is illustrated that the voltage drop level of the high voltage VPP is relatively small.

The voltage generation circuit 100 generates the oscillating signal OSC, which is toggling, while the oscillating control signal OSC_EN is enabled to a logic high level. The counting circuit 200 generates the counting signal CNT by counting the toggling number of the oscillating signal OSC. When the oscillating control signal OSC_EN is enabled to a logic high level for a relatively short time, the counting value (e.g., 4) of the counting signal CNT is relatively small. The voltage adjust circuit 300 increases the voltage level of the adjusting voltage VCH in proportion to the counting value (e.g., 4) of the counting signal CNT. For example, the adjusting voltage VCH has a voltage level greater than the source voltage VDD by a first level.

The oscillating circuit 110 of the voltage generation circuit 100 generates the first clock signal CLK1 and the second clock signal CLK2 which have a higher frequency according to the adjusting voltage VCH. The pumping circuit 120 pumps the source voltage VDD faster so that the high voltage VPP can reach a target voltage level more quickly.

Referring to FIG. 7B, it is illustrated that the voltage drop level of the high voltage VPP is relatively large.

The voltage generation circuit 100 generates the oscillating signal OSC, which is toggling, while the oscillating control signal OSC_EN is enabled to a logic high level. The counting circuit 200 generates the counting signal CNT by counting the toggling number of the oscillating signal OSC. When the oscillating control signal OSC_EN is enabled to a logic high level for a relatively long time, the counting value (e.g., 24) of the counting signal CNT is relatively large. The voltage adjust circuit 300 increases the voltage level of the adjusting voltage VCH in proportion to the counting value (e.g., 24) of the counting signal CNT. For example, the adjusting voltage VCH has a voltage level greater than the source voltage VDD by a second level greater than the first level.

The oscillating circuit 110 of the voltage generation circuit 100 generates the first clock signal CLK1 and the second clock signal CLK2 which have a higher frequency according to the adjusting voltage VCH. The pumping circuit 120 pumps the source voltage VDD faster so that the high voltage VPP can reach a target voltage level more quickly.

Meanwhile, in the embodiment shown in FIG. 1, it is illustrated that an operation of the oscillating circuit 110 is controlled by the adjusting voltage VCH. Hereinafter, a case where the reference voltage VREF is adjusted by the adjusting voltage VCH will be described.

Figure 8:
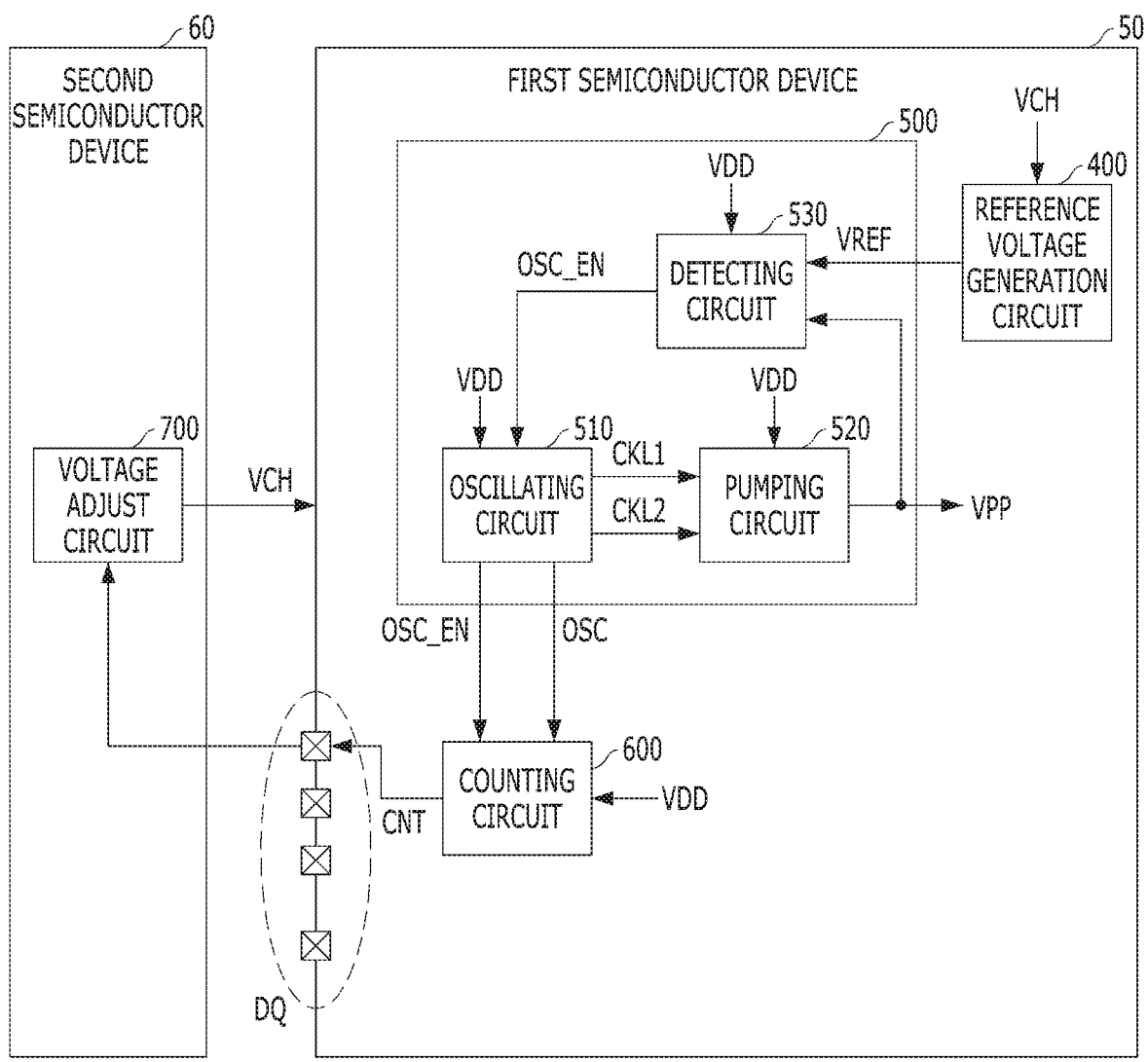
FIG. 8 is a block diagram illustrating a semiconductor system in accordance with an embodiment of the present invention.

FIG. 8 is a block diagram illustrating a semiconductor system 40 in accordance with an embodiment of the present invention.

Referring to FIG. 8, the semiconductor system 40 may include a first semiconductor device 50 and a second semiconductor device 60.

The second semiconductor device 60 may include a voltage adjust circuit 700 for generating an adjusting voltage VCH according to a counting signal CNT. The second semiconductor device 60 may be substantially the same as the second semiconductor device 30 of FIG. 1.

The first semiconductor device 50 may include a reference voltage generation circuit 400, a voltage generation circuit 500 and a counting circuit 600.

The reference voltage generation circuit 400 may adjust a voltage level of the reference voltage VREF according to the adjusting voltage VCH. The voltage generation circuit 500 may generate the oscillating control signal OSC_EN based on a high voltage VPP and the reference voltage VREF. The voltage generation circuit 500 may generate operational clock signals CLK1 and CLK2 according to the oscillating control signal OSC_EN. The voltage generation circuit 500 may generate the high voltage VPP by pumping the source voltage VDD according to the operational clock signals CLK1 and CLK2. The counting circuit 600 may generate the counting signal CNT by counting an oscillating signal OSC corresponding to the operational clock signals CLK1 and CLK2 in response to the oscillating control signal OSC_EN. The counting circuit 600 may be substantially the same as the counting circuit 200.

The voltage generation circuit 500 may include an oscillating circuit 510, a pumping circuit 520, and a detecting circuit 530.

The oscillating circuit 510 may be activated by the oscillating control signal OSC_EN, and output the operational clock signals CLK1 and CLK2. The oscillating circuit 510 may be substantially the same as the oscillator 114, except that the oscillating circuit 510 uses the source voltage VDD instead of the driving voltage V_DR. The pumping circuit 520 and the detecting circuit 530 may be substantially the same as the pumping circuit 120 and the detecting circuit 130.

Figure 9:
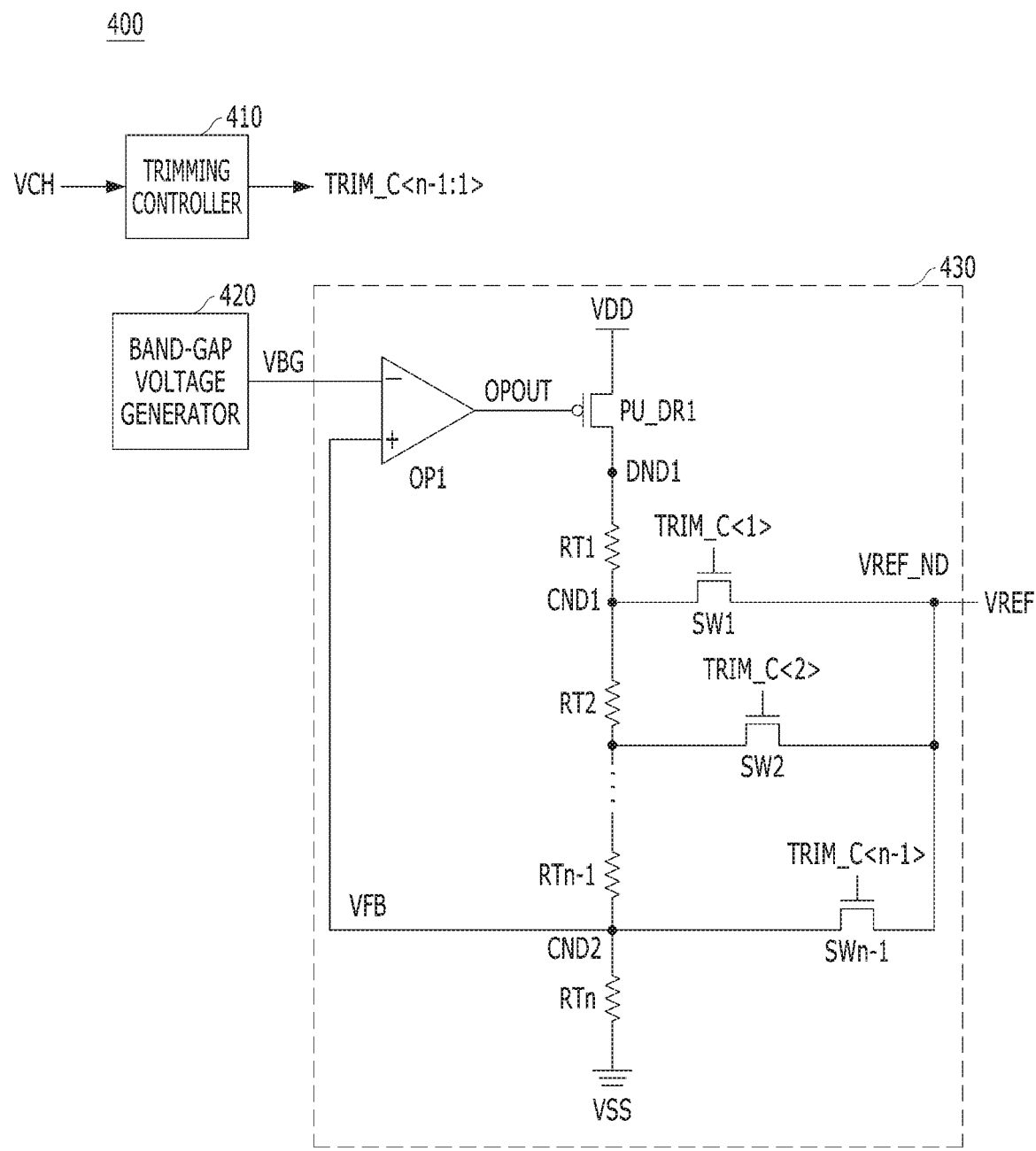
FIG. 9 is a circuit diagram of a reference voltage generation circuit of FIG. 8.

FIG. 9 is a circuit diagram of the reference voltage generation circuit 400 of FIG. 8.

Referring to FIG. 9, the reference voltage generation circuit 400 may include a trimming controller 410, a bandgap voltage generator 420 and a voltage trimmer 430.

The trimming controller 410 may generate a trimming code TRIM_C<n−1:1> having multiple bits, according to the adjusting voltage VCH. The trimming controller 410 may detect a voltage level of the adjusting voltage VCH, and generate the trimming code TRIM_C<n−1:1> corresponding to the detected voltage level. The trimming controller 410 may generate the trimming code TRIM_C<n−1:1> so the reference voltage generation circuit 400 generates the reference voltage VREF having a higher voltage level as the voltage level of the adjusting voltage VCH increases.

The band-gap voltage generator 420 may be a bad-gap voltage VBG having a constant voltage level regardless of a variation of a voltage supplied from an external.

The voltage trimmer 430 may output the reference voltage VREF by trimming the bad-gap voltage VBG according to the trimming code TRIM_C<n−1:1>.

In detail, the voltage trimmer 430 may include a comparator OP1, a pull-up driver PU_DR1, a plurality of trimming resistors RT1 to RTn, and a plurality of switches SW1 to SWn−1. The pull-up driver PU_DR1 may be composed of a PMOS transistor, and the plurality of switches SW1 to SWn−1 may be composed of transistors, e.g., NMOS transistors.

The comparator OP1 may output a driving control signal OPOUT by comparing the bad-gap voltage VBG with a feedback voltage VFB. The comparator OP1 may output the driving control signal OPOUT transiting to a logic low level when the feedback voltage VFB has a voltage level lower than the bad-gap voltage VBG.

The pull-up driver PU_DR1 may drive a first node DND1 to a source voltage VDD according to the driving control signal OPOUT.

The plurality of trimming resistors RT1 to RTn may be coupled in series between the first node DND1 and a ground voltage (VSS) terminal. For reference, the feedback voltage VFB may be outputted from a common node CND2 of two adjacent resistors RTn−1 and RTn, which are closest to the ground voltage (VSS) terminal among the plurality of trimming resistors RT1 to RTn.

The plurality of switches SW1 to SWn−1 may be coupled to an output terminal VREF_ND and respective common nodes of two adjacent resistors among the plurality of trimming resistors RT1 to RTn. The reference voltage VREF may be outputted from the output terminal VREF_ND. For example, a first switch SW1 may be coupled between the output terminal VREF_ND and a common node CND1 of a first trimming resistor RT1 and a second trimming resistor RT2. Each of the plurality of switches SW1 to SWn−1 may be turned on in response to a corresponding bit of the trimming code TRIM_C<n−1:1>.

Accordingly, a voltage of the first node DND1 is divided by the plurality of trimming resistors RT1 to RTn, and the reference voltage VREF outputted from the output terminal VREF_ND has a voltage level determined according to a turned-on switch of the plurality of switches SW1 to SWn−1. For example, when the first switch SW1 is turned on in response to a first bit TRIM_C<1> of the trimming code TRIM_C<n−1:1>, the reference voltage VREF may be outputted by dividing the voltage of the first node DND1 by a ratio of the first trimming resistor RT1 to the remainder resistors RT2 to RTn.

As described above, the reference voltage generation circuit 400 may generate the trimming code TRIM_C<n−1:1> according to the adjusting voltage VCH, and adjust the voltage level of a reference voltage VREF according to the trimming code TRIM_C<n−1:1>. The reference voltage generation circuit 400 may generate the trimming code TRIM_C<n−1:1> so that the reference voltage VREF has a higher voltage level as the voltage level of the adjusting voltage VCH increases.

The voltage generation circuit 500 may adjust a voltage level of the high voltage VPP according to the reference voltage VREF whose voltage level is adjusted by the adjusting voltage VCH.

In accordance with the present invention, a semiconductor device can detect a voltage drop level of an internal voltage in real time, and adjust a voltage level of the internal voltage based on a voltage drop detection results, thereby producing the internal voltage having a more stable voltage level.

As is apparent from the above descriptions, the semiconductor device in accordance with the embodiment selects a clock used for sampling data depending on a clock tree delay value during a training operation, and samples data based on the selected clock during a write operation. Therefore, the semiconductor device may secure a sufficient margin for the setup/hold time at the time of data sampling.

While the present invention has been described with respect to specific embodiments, the embodiments are not intended to be restrictive, but rather descriptive. Further, it is noted that the present invention may be achieved in various ways through substitution, change, and modification, by those skilled in the art without departing from the spirit and/or scope of the present invention as defined by the following claims.

What is claimed is:

1. A semiconductor device comprising:
    a voltage adjust circuit suitable for generating an adjusting voltage according to a counting signal;
    an oscillating circuit operable by an oscillating control signal, and suitable for outputting an operational clock signal whose frequency is controlled by the adjusting voltage;
    a pumping circuit suitable for generating an internal voltage by pumping a source voltage according to the operational clock signal; and
    a counting circuit suitable for generating the counting signal by counting the operational clock signal according to the oscillating control signal.

2. The semiconductor device of claim 1, wherein the oscillating circuit includes:
    a voltage supplier suitable for providing a driving voltage according to the source voltage or the adjusting voltage; and
    an oscillator operable by the oscillating control signal and suitable for generating the operational clock signal by using the driving voltage.

3. The semiconductor device of claim 1, further comprising a detecting circuit suitable for outputting the oscillating control signal by comparing a reference voltage with the internal voltage.

4. The semiconductor device of claim 1, wherein the counting circuit includes:
    at least one monitoring block suitable for outputting at least one monitoring signal by monitoring characteristics of a PMOS transistor or an NMOS transistor in response to an enable signal;
    a counting selector suitable for selecting the monitoring signal or operational clock signal in response to the oscillating control signal; and
    a counter suitable for outputting the counting signal by counting a toggling number of an output signal of the counting selector based on the enable signal or the oscillating control signal.

5. The semiconductor device of claim 4,
    wherein the counter performs a counting operation when the enable signal or the oscillating control signal is enabled; and
    wherein the counter initializes the counting signal when the enable signal or the oscillating control signal is disabled.

6. The semiconductor device of claim 1, wherein the voltage adjust circuit increases a voltage level of the adjusting voltage in proportion to a counting value of the counting signal.

7. A semiconductor device comprising:
- a voltage adjust circuit suitable for generating an adjusting voltage according to a counting signal;
- a reference voltage generation circuit suitable for adjusting a voltage level of a reference voltage according to the adjusting voltage;
- a detecting circuit suitable for outputting an oscillating control signal by comparing the reference voltage with an internal voltage;
- an oscillating circuit suitable for outputting an operational clock signal in response to the oscillating control signal;
- a pumping circuit suitable for generating the internal voltage by pumping a source voltage according to the operational clock signal; and
- a counting circuit suitable for generating the counting signal by counting the operational clock signal according to the oscillating control signal.

8. The semiconductor device of claim 7, wherein the reference voltage generation circuit includes:
- a trimming controller suitable for generating a trimming code having multiple bits according to the adjusting voltage;
- a band-gap voltage generator suitable for generating a band-gap voltage having a constant voltage level; and
- a voltage trimmer suitable for adjusting the voltage level of the reference voltage by trimming the band-gap voltage according to the trimming code.

9. The semiconductor device of claim 8, wherein the voltage trimmer adjusts the voltage level of the reference voltage to a higher level as a voltage level of the adjusting voltage increases, which is reflected into the trimming code by the trimming controller.

10. The semiconductor device of claim 7, wherein the counting circuit includes:
- at least one monitoring block suitable for outputting at least one monitoring signal by monitoring characteristics of a PMOS transistor or an NMOS transistor in response to an enable signal;
- a counting selector suitable for selecting the monitoring signal or operational clock signal in response to the oscillating control signal; and
- a counter suitable for outputting the counting signal by counting a toggling number of an output signal of the counting selector based on the enable signal or the oscillating control signal.

11. The semiconductor device of claim 10,
wherein the counter performs a counting operation when the enable signal or the oscillating control signal is enabled; and
wherein the counter initializes the counting signal when the enable signal or the oscillating control signal is disabled.

12. The semiconductor device of claim 7, wherein the voltage adjust circuit increases a voltage level of the adjusting voltage in proportion to a counting value of the counting signal.

13. A semiconductor system comprising:
- a first semiconductor device that includes a voltage adjust circuit suitable for generating an adjusting voltage according to a counting signal; and
- a second semiconductor device that includes:
  - a voltage generation circuit operable by an oscillating control signal, and suitable for outputting an operational clock signal according to the adjusting voltage and generating an internal voltage by pumping a source voltage according to the operational clock signal; and
  - a counting circuit suitable for generating the counting signal by counting the operational clock signal according to the oscillating control signal.

14. The semiconductor system of claim 13, wherein the counting signal is outputted through at least one of data input/output (I/O) pads from the second semiconductor device to the first semiconductor device.

15. The semiconductor system of claim 13, wherein the voltage generation circuit includes:
- an oscillating circuit operable by the oscillating control signal, and suitable for outputting the operational clock signal whose frequency is controlled by the adjusting voltage;
- a pumping circuit suitable for generating the internal voltage by pumping the source voltage according to the operational clock signal; and
- a detecting circuit suitable for outputting the oscillating control signal by comparing a reference voltage with the internal voltage.

16. The semiconductor system of claim 15, wherein the oscillating circuit includes:
- a voltage supplier suitable for providing a driving voltage according to the source voltage or the adjusting voltage; and
- an oscillator operable by the oscillating control signal and suitable for generating the operational clock signal by using the driving voltage.

17. The semiconductor system of claim 13, wherein the counting circuit includes:
- at least one monitoring block suitable for outputting at least one monitoring signal by monitoring characteristics of a PMOS transistor or an NMOS transistor in response to an enable signal;
- a counting selector suitable for selecting the monitoring signal or operational clock signal in response to the oscillating control signal; and
- a counter suitable for outputting the counting signal by counting a toggling number of an output signal of the counting selector based on the enable signal or the oscillating control signal.

* * * * *